(12) United States Patent
Terada et al.

(10) Patent No.: US 9,865,288 B2
(45) Date of Patent: Jan. 9, 2018

(54) SUSPENSION BOARD WITH CIRCUIT

(71) Applicant: NITTO DENKO CORPORATION, Osaka (JP)

(72) Inventors: Naohiro Terada, Osaka (JP); Saori Kanezaki, Osaka (JP); Hiroyuki Tanabe, Osaka (JP); Yoshito Fujimura, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 74 days.

(21) Appl. No.: 15/040,199

(22) Filed: Feb. 10, 2016

(65) Prior Publication Data
US 2016/0239055 A1 Aug. 18, 2016

(30) Foreign Application Priority Data

Feb. 18, 2015 (JP) ................ 2015-029615

(51) Int. Cl.
*G11B 15/48* (2006.01)
*H05K 1/05* (2006.01)
*G11B 5/48* (2006.01)
*H05K 3/30* (2006.01)

(52) U.S. Cl.
CPC .......... *G11B 5/4853* (2013.01); *G11B 5/4826* (2013.01); *G11B 5/4873* (2013.01); *H05K 1/056* (2013.01); *H05K 3/305* (2013.01); *Y02P 70/613* (2015.11)

(58) Field of Classification Search
CPC .......... G06F 1/20; G06F 1/183; H05K 3/305; H05K 1/056; G11B 5/4826; G11B 5/4873; G11B 5/4853
See application file for complete search history.

(56) References Cited

U.S. PATENT DOCUMENTS 5,986,853 A * 11/1999 Simmons ............ G11B 5/4846
360/245.9
6,215,622 B1 * 4/2001 Ruiz ...................... G11B 5/484
360/244.3
6,664,685 B2 * 12/2003 Ameen .................. F16C 17/10
310/45

(Continued)

FOREIGN PATENT DOCUMENTS

JP 2012-099204 A 5/2012

*Primary Examiner* — Robert J Hoffberg
*Assistant Examiner* — Matt Dhillon
(74) *Attorney, Agent, or Firm* — Edwards Neils LLC; Jean C. Edwards, Esq.

(57) ABSTRACT

A suspension board with circuit includes one pair of pedestals. A pedestal conductive layer of one pedestal has a fan portion and a continuous portion. The pedestal conductive layer of the other pedestal has at least the fan portion. When the pedestal conductive layer of the other pedestal has only the fan portion, the pedestal supporting layer is disposed so as to be overlapped with the fan portion in the thickness direction in each of the pedestals and so as not to be overlapped with the continuous portion in the one pedestal and when the pedestal conductive layer of the other pedestal has the continuous portion, the pedestal supporting layer is disposed so as to be overlapped with the continuous portion or is disposed so as to be overlapped with the fan portion and so as not to be overlapped with the continuous portion in each of the pedestals.

12 Claims, 10 Drawing Sheets

(56) References Cited

U.S. PATENT DOCUMENTS

| | | | | |
|---|---|---|---|---|
| 6,898,841 B2* | 5/2005 | Shiraishi | ............... | G11B 5/4833 |
| | | | | 29/603.04 |
| 7,133,259 B2* | 11/2006 | Takagi | ................. | G11B 5/4833 |
| | | | | 360/244.3 |
| 7,355,818 B2* | 4/2008 | McReynolds | ........ | G11B 5/4846 |
| | | | | 360/264.2 |
| 7,542,239 B2* | 6/2009 | Resh | .................... | G11B 5/4833 |
| | | | | 360/244.3 |
| 7,898,770 B1* | 3/2011 | Zhang | ................. | G11B 5/4833 |
| | | | | 360/244.5 |
| 9,418,687 B2* | 8/2016 | Terada | ................... | G11B 5/486 |
| 9,524,738 B1* | 12/2016 | Pan | ........................ | G11B 5/48 |
| 2006/0221503 A1* | 10/2006 | Watadani | ............ | G11B 5/4833 |
| | | | | 360/244.8 |
| 2012/0087041 A1* | 4/2012 | Ohsawa | ............... | G11B 5/4826 |
| | | | | 360/234.5 |
| 2013/0248233 A1* | 9/2013 | Kanezaki | ................. | H05K 1/18 |
| | | | | 174/260 |

\* cited by examiner

SUSPENSION BOARD WITH CIRCUIT

CROSS-REFERENCE TO RELATED APPLICATION

The present application claims priority from Japanese Patent Application No. 2015-29615 filed on Feb. 18, 2015, the contents of which are hereby incorporated by reference into this application.

BACKGROUND OF THE INVENTION

Field of the Invention

The present invention relates to a suspension board with circuit, to be specific, to a suspension board with circuit used in a hard disk drive.

Description of Related Art

A suspension board with circuit that is mounted with a slider having a magnetic head and is mounted on a hard disk drive has been conventionally known. The suspension board with circuit includes a metal supporting board, a base insulating layer disposed on one surface of the metal supporting board, a conductive layer disposed on one surface of the base insulating layer and including a wire, and a cover insulating layer disposed on one surface of the base insulating layer and covering the conductive layer.

As such a suspension board with circuit, for example, a suspension board with circuit in which a plurality of pedestals supporting a slider are included and each of the plurality of pedestals includes a base insulating layer, a conductive pattern formed thereon, a cover insulating layer formed on the base insulating layer so as to cover the conductive pattern, and an upper-side supporting layer formed on the cover insulating layer has been proposed (ref: for example, Japanese Unexamined Patent Publication No. 2012-99204).

In the suspension board with circuit, the slider is provided so as to be in contact with the upper surfaces of the plurality of pedestals.

SUMMARY OF THE INVENTION

In the suspension board with circuit described in Japanese Unexamined Patent Publication No. 2012-99204, in order to stably support the slider, forming the conductive pattern corresponding to the pedestal into a circular shape is considered. Also, the wire may be continuous to a circular portion in the conductive pattern so as to ensure efficient wiring around of the wire.

A thickness of the cover insulating layer depends on the area of the conductive pattern covered with the cover insulating layer. To be specific, the larger the area of the conductive pattern is, the thicker the thickness of the cover insulating layer is and the smaller the area of the conductive pattern is, the thinner the thickness of the cover insulating layer is.

Thus, the cover insulating layer that covers a continuous portion of the circular portion of the conductive pattern to the wire is relatively thicker than the cover insulating layer that covers only the circular portion. That is, based on a difference in thickness of the cover insulating layer, a height (size in a thickness direction of the suspension board with circuit) of the pedestal including the circular portion to which the wire is continuous is nonuniform, compared to that of the pedestal including the circular portion to which the wire is not continuous.

As a result, when the plurality of pedestals include a pedestal including a circular portion to which the wire is continuous and a pedestal including a circular portion to which the wire is not continuous, there is a disadvantage that the position accuracy of the slider that is disposed on the plurality of pedestals in the thickness direction of the suspension board with circuit is reduced.

When the plurality of pedestals include a plurality of pedestals including circular portions to which the wires are continuous, uniform height of the pedestals is desired.

It is an object of the present invention to provide a suspension board with circuit that has an easy structure and is capable of improving the position accuracy of a slider in a thickness direction.

The present invention [1] includes a suspension board with circuit including a supporting portion configured to support a slider and extending in a predetermined direction includes a metal supporting layer, a base insulating layer disposed at one surface in a thickness direction of the metal supporting layer, a conductive pattern disposed at one surface in the thickness direction of the base insulating layer, a cover insulating layer disposed at the one surface in the thickness direction of the base insulating layer so as to cover the conductive pattern, and a supporting layer disposed at one surface in the thickness direction of the cover insulating layer, wherein the supporting portion includes at least one pair of pedestals disposed at spaced intervals to each other in the predetermined direction; each of the one pair of pedestals includes a pedestal base layer included in the base insulating layer, a pedestal conductive layer included in the conductive pattern and disposed at one surface in the thickness direction of the pedestal base layer, a pedestal cover layer included in the cover insulating layer and disposed at one surface in the thickness direction of the pedestal conductive layer, and a pedestal supporting layer included in the supporting layer and disposed at one surface in the thickness direction of the pedestal cover layer; of the one pair of pedestals, the pedestal conductive layer of one pedestal has a fan portion in which at least a part of the circumferential end portion thereof has a circular arc shape and a continuous portion continuous from the fan portion in a circumferential direction thereof and having a protruding portion protruding outwardly in a radial direction of a phantom circle with respect to the phantom circle sharing the center with the fan portion; and of the one pair of pedestals, the pedestal conductive layer of the other pedestal has at least the fan portion and when the pedestal conductive layer of the other pedestal has only the fan portion, the pedestal supporting layer is disposed so as to be overlapped with the fan portion in the thickness direction in each of the one pair of pedestals and so as not to be overlapped with the continuous portion in the thickness direction in the one pedestal and when the pedestal conductive layer of the other pedestal further has the continuous portion, the pedestal supporting layer is disposed so as to be overlapped with the continuous portion or is disposed so as to be overlapped with the fan portion and so as not to be overlapped with the continuous portion in the thickness direction in each of the one pair of pedestals.

According to the structure, the pedestal conductive layer of the one pedestal has the fan portion and the continuous portion that is continuous from the fan portion in the circumferential direction and has the protruding portion, so that the pedestal cover layer of the one pedestal includes a relatively thin portion covering the fan portion and a relatively thick portion covering the continuous portion.

When the pedestal conductive layer of the other pedestal has only the fan portion, the pedestal cover layer of the other pedestal has only the relatively thin portion covering the fan portion.

In this case, the pedestal supporting layer is disposed on the corresponding pedestal cover layer so as to be overlapped with the fan portion in the thickness direction in each of the one pair of pedestals and so as not to be overlapped with the continuous portion in the thickness direction in the one pedestal.

That is, the pedestal supporting layer is locally disposed in the relatively thin portion in the pedestal cover layer without being disposed in the relatively thick portion in the pedestal cover layer in each of the one pair of pedestals.

Thus, unevenness of the height (size in the thickness direction) of each of the one pair of pedestals can be suppressed.

When the pedestal conductive layer of the other pedestal further has the continuous portion that is continuous from the fan portion in the circumferential direction and has the protruding portion, the pedestal cover layer of the other pedestal includes the relatively thin portion covering the fan portion and the relatively thick portion covering the continuous portion.

In this case, the pedestal supporting layer is disposed on the corresponding pedestal cover layer so as to be overlapped with the continuous portion or is disposed so as to be overlapped with the fan portion and so as not to be overlapped with the continuous portion in the thickness direction in each of the one pair of pedestals.

That is, the pedestal supporting layer is disposed in the relatively thick portion in the pedestal cover layer or is locally disposed in the relatively thin portion in the pedestal cover layer without being disposed in the relatively thick portion in the pedestal cover layer in each of the one pair of pedestals.

Thus, unevenness of the height (size in the thickness direction) of each of the one pair of pedestals can be suppressed.

As a result, the one pair of pedestals can accurately support the slider and the position accuracy of the slider in the thickness direction can be improved.

The present invention [2] includes, in the suspension board with circuit described in the above-described [1], the supporting portion including a plurality of pairs of pedestals with the pairs being at spaced intervals in a widthwise direction crossing both directions of the predetermined direction and the thickness direction.

According to the structure, the supporting portion includes the plurality of pairs of pedestals, so that the supporting portion can stably support the slider.

The present invention [3] includes, in the suspension board with circuit described in the above-described [1] or [2], all of the pedestal supporting layers of the pedestals having the same shapes as seen from the thickness direction.

According to the structure, all of the pedestal supporting layers have the same shapes as seen from the thickness direction, so that unevenness of the height of each of the pedestals can be suppressed and the position accuracy of the slider in the thickness direction can be further improved.

DETAILED DESCRIPTION OF THE INVENTION

1. First Embodiment

Figure 1:
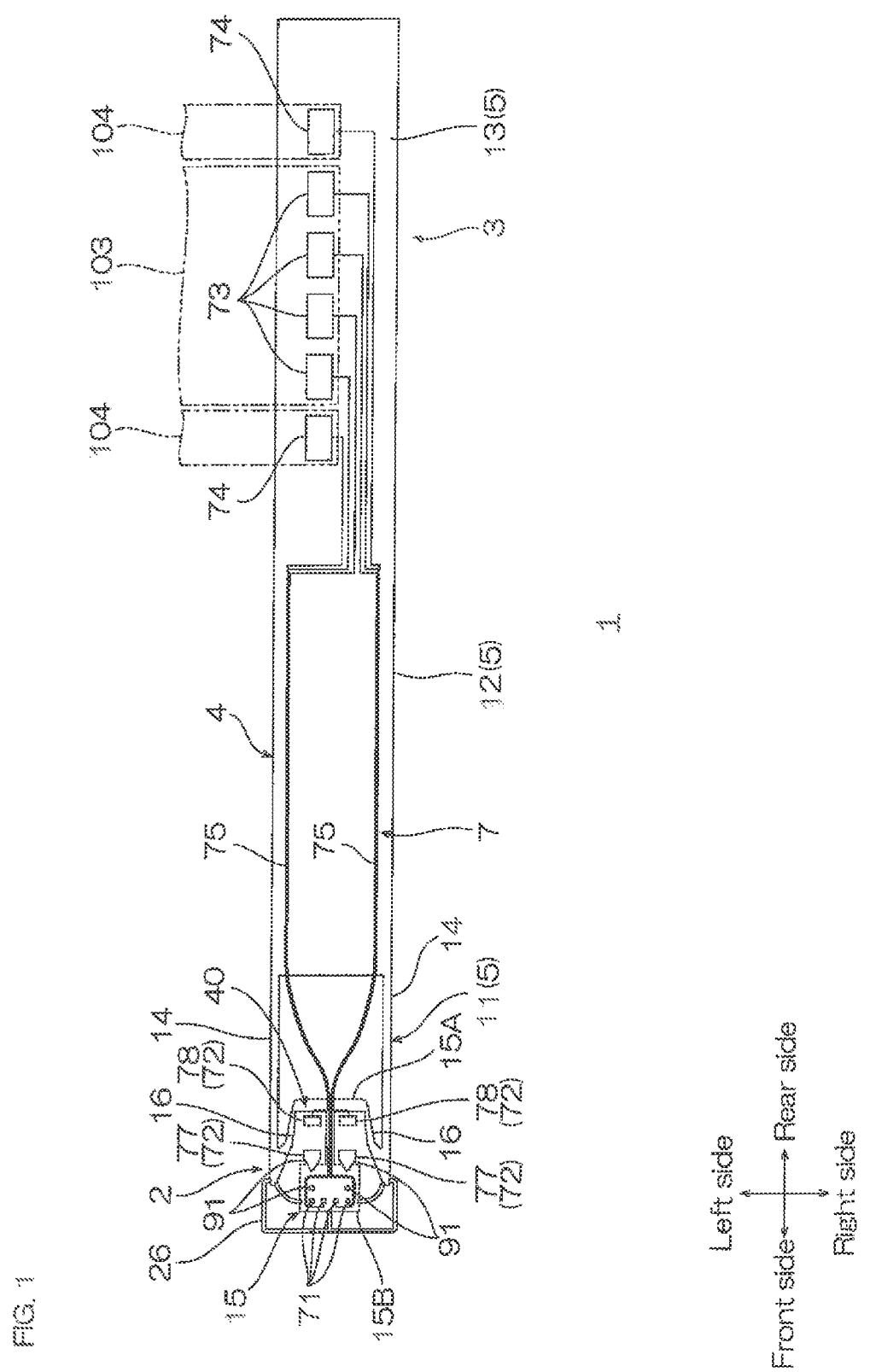
FIG. 1 shows a plan view of a first embodiment of a suspension board with circuit of the present invention.
Figure 4:
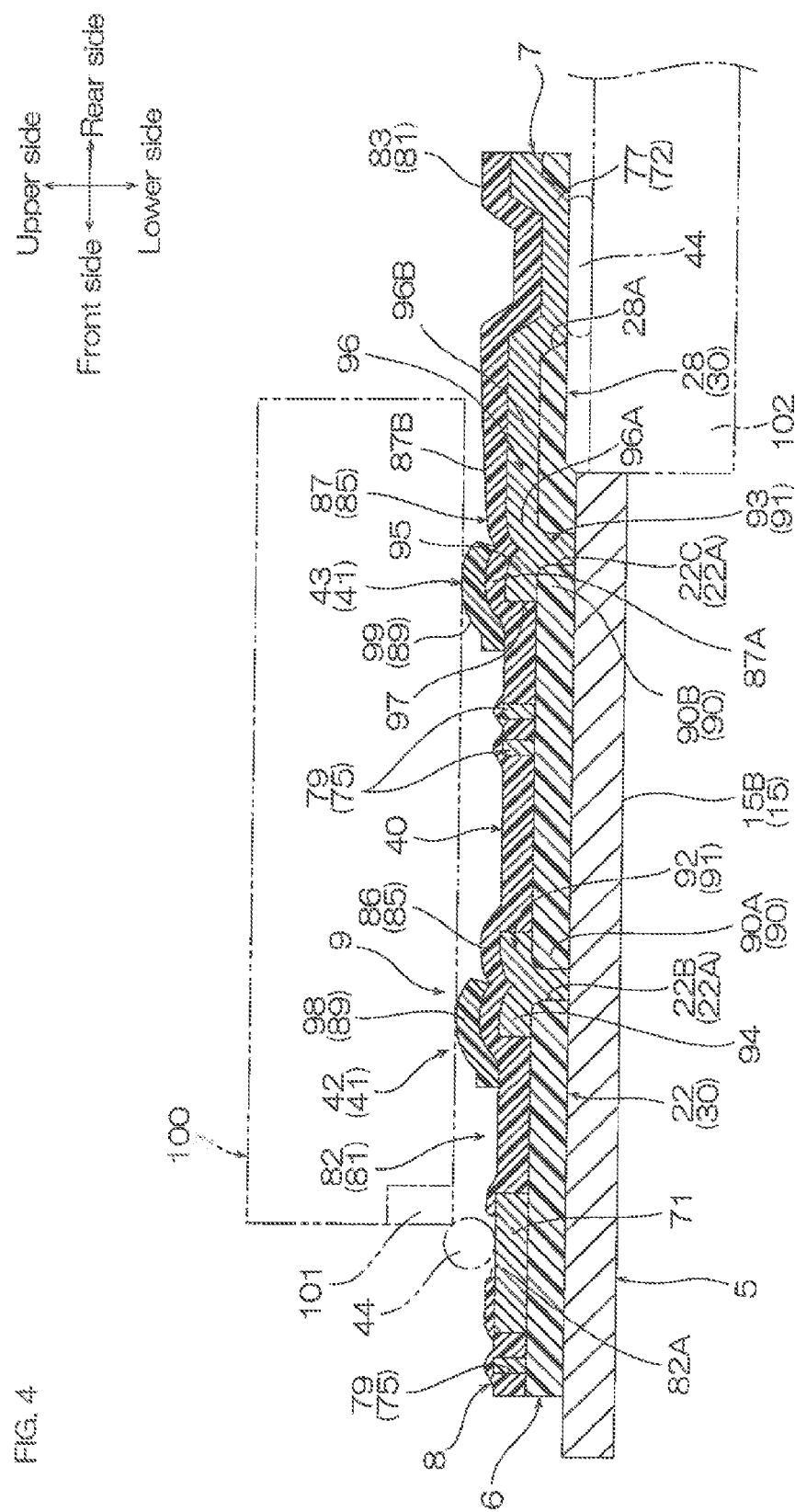
FIG. 4 shows an A-A sectional view of the slider mounting region shown in FIG. 3.

As shown in FIGS. 1 and 4, a suspension board with circuit 1 is mounted with a slider 100 having a magnetic head 101 and piezoelectric elements 102 to be then mounted on a hard disk drive (not shown) in a state of being electrically connected to an external board 103 and power sources 104.

As shown in FIG. 1, the suspension board with circuit 1 has a generally flat belt shape extending in a predetermined direction. The suspension board with circuit 1 includes a mounted portion 2 that is disposed at one side in the predetermined direction (left side of the paper surface in FIG. 1) thereof and is mounted with the slider 100 (ref: FIG. 4), an external connecting portion 3 that is disposed at the other side in the predetermined direction (right side of the paper surface in FIG. 1) thereof and is connected to the external board 103 and the power sources 104, and a wire portion 4 that extends in the predetermined direction between the mounted portion 2 and the external connecting portion 3.

In the following description, when referring to directions, the one side in the predetermined direction at which the mounted portion 2 is provided is referred to as a front side of the suspension board with circuit 1 and the other side in the predetermined direction at which the external connecting portion 3 is provided is referred to as a rear side thereof. That is, a front-rear direction is one example of the predetermined direction.

In FIG. 1, the up-down direction of the paper surface is referred to as a right-left direction as one example of a widthwise direction; the upper side of the paper surface is referred to as a left side as one example of the one side in the widthwise direction; and the lower side of the paper surface is referred to as a right side as one example of the other side in the widthwise direction. In FIG. 1, the paper thickness direction is referred to as an up-down direction as one example of the thickness direction; the near side of the paper surface is referred to as an upper side as one example of the one side in the thickness direction, and the far side of the paper surface is referred to as a lower side as one example of the other side in the thickness direction. To be specific, directions are in conformity with direction arrows shown in each view.

As shown in FIG. 4, the suspension board with circuit 1 includes a metal supporting board 5 as one example of a metal supporting layer, a base insulating layer 6, a conductive pattern 7, a cover insulating layer 8, and a supporting layer 9. The suspension board with circuit 1 has a laminate structure in which the metal supporting board 5, the base insulating layer 6, the conductive pattern 7, the cover insulating layer 8, and the supporting layer 9 are sequentially laminated from the lower side upwardly. For convenience, in FIG. 1, the base insulating layer 6, the cover insulating layer 8, and the supporting layer 9 are omitted and in FIG. 2, the cover insulating layer 8 and the supporting layer 9 are omitted.

As shown in FIG. 1, the metal supporting board 5 has a generally flat plate shape extending in the front-rear direction and includes a gimbal portion 11 corresponding to the mounted portion 2, a board wire portion 12 corresponding to the wire portion 4, and a board connecting portion 13 corresponding to the external connecting portion 3.

Figure 2:
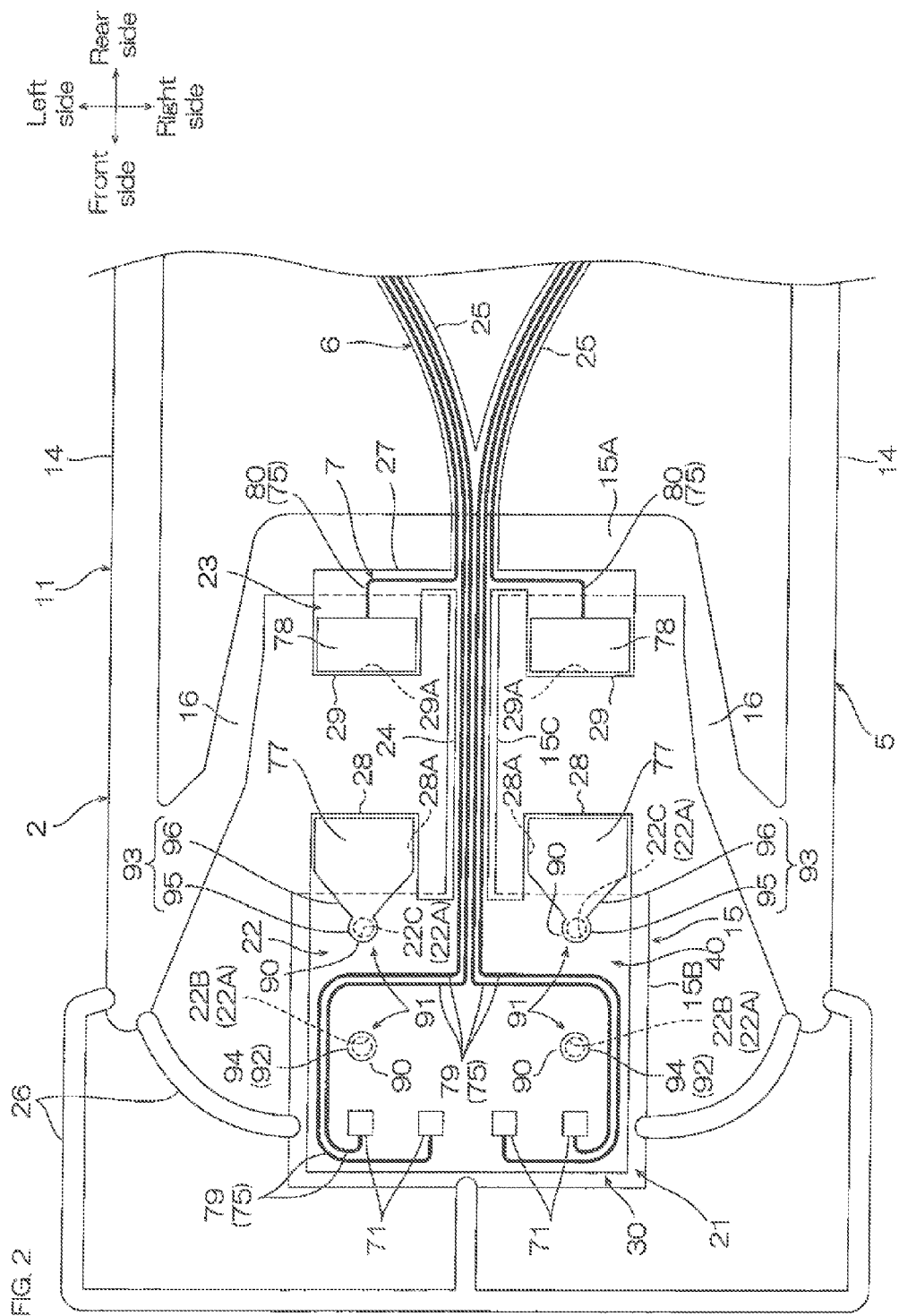
FIG. 2 shows an enlarged plan view of a mounted portion shown in FIG. 1 for illustrating a state excluding a cover insulating layer and a supporting layer.

The gimbal portion 11 is a front end portion of the metal supporting board 5 and as shown in FIG. 2, includes one pair of outrigger portions 14, one pair of connecting portions 16, and a mounting portion 15.

The one pair of outrigger portions 14 are both end portions in the right-left direction of the gimbal portion 11 and are disposed at spaced intervals to each other in the right-left direction. Each of the one pair of outrigger portions 14 has a generally rectangular shape in plane view extending in the front-rear direction. The rear end portions of the one pair of outrigger portions 14 are connected to both end portions in the right-left direction at the front end edge of the board wire portion 12.

Each of the one pair of connecting portions 16 corresponds to each of the one pair of outrigger portions 14. Each of the one pair of connecting portions 16 extends continuously from the front end portion of the corresponding outrigger portion 14 so as to gradually incline rearwardly toward the inner side in the right-left direction. The rear end portions of the one pair of connecting portions 16 are disposed at spaced intervals to each other in the right-left direction.

The mounting portion 15 is disposed between the one pair of connecting portions 16 in the right-left direction. The mounting portion 15 has a generally H-shape in plane view and includes a foundation portion 15A, a stage 15B, and a bridged portion 15C.

The foundation portion 15A is a rear-side portion of the mounting portion 15 and has a generally rectangular shape in plane view extending in the right-left direction. Each of both end portions in the right-left direction of the foundation portion 15A is connected to the rear end portion of the corresponding connecting portion 16.

The stage 15B is a front-side portion of the mounting portion 15 and is disposed at spaced intervals to the front side of the foundation portion 15A. The stage 15B has a generally rectangular shape in plane view.

The bridged portion 15C is a central portion in the front-rear direction of the mounting portion 15 and connects the foundation portion 15A to the stage 15B in the front-rear direction. The bridged portion 15C has a generally rectangular shape in plane view extending in the front-rear direction. The rear end portion of the bridged portion 15C is connected to the generally center in the right-left direction at the front end portion of the foundation portion 15A, and the front end portion thereof is connected to the generally center in the right-left direction at the rear end portion of the stage 15B.

As shown in FIG. 1, the board wire portion 12 is disposed at the rear side of the gimbal portion 11 and has a generally rectangular shape in plane view extending in the front-rear direction.

The board connecting portion 13 has a generally rectangular shape in plane view extending toward the rear side continuously from the rear end portion of the board wire portion 12.

The metal supporting board 5 is, for example, formed of a metal material such as stainless steel, 42-alloy, aluminum, copper-beryllium, and phosphor bronze. Preferably, the metal supporting board 5 is formed of stainless steel. The metal supporting board 5 has a thickness of, for example, 10 μm or more, or preferably 15 μm or more, and, for example, 35 μm or less, or preferably 25 μm or less.

As shown in FIG. 4, the base insulating layer 6 is disposed on the upper surface of the metal supporting board 5. As shown in FIG. 2, the base insulating layer 6 includes a base mounted portion 21 corresponding to the gimbal portion 11, a base wire portion (not shown) corresponding to the board wire portion 12, and a base connecting portion (not shown) corresponding to the board connecting portion 13.

The base mounted portion 21 includes a first mounting portion 30, a second mounting portion 23, a base bridged portion 24, a wire supporting portion 25, and a base connecting portion 26.

The first mounting portion 30 is disposed at the front-side portion of the base mounted portion 21 and integrally includes a slider mounting portion 22 and front-side element mounting portions 28.

The slider mounting portion 22 is disposed on the upper surface of the stage 15B and has a generally rectangular shape in plane view. The rear end edge of the slider mounting portion 22 generally coincides with the rear end edge of the stage 15B as seen from the up-down direction. As shown in FIG. 4, the upper surface of the slider mounting portion 22 extends along the front-rear and right-left directions.

As shown in FIG. 2, the slider mounting portion 22 has a plurality (four pieces) of through holes 22A. Each of the plurality (four pieces) of through holes 22A has a generally circular shape in plane view and passes through the slider mounting portion 22 in the up-down direction.

To be more specific, the plurality (four pieces) of through holes 22A include a plurality (two pieces) of first through holes 22B and a plurality (two pieces) of second through holes 22C.

The plurality of first through holes 22B are disposed at the generally central portion in the front-rear direction of the slider mounting portion 22 at spaced intervals to each other in the right-left direction.

The plurality of second through holes 22C are disposed at spaced intervals to the rear side of the plurality of first through holes 22B and are disposed at the rear end portion of the slider mounting portion 22 at spaced intervals to each other in the right-left direction.

In the slider mounting portion 22, the circumferential end portion of each of the plurality of through holes 22A corresponds to pedestal base layers 90. That is, the base insulating layer 6 includes a plurality (four pieces) of pedestal base layers 90. As shown in FIG. 4, the plurality of pedestal base layers 90 include a plurality (two pieces) of first pedestal base layers 90A that are circumferential end portions of the plurality of first through holes 22B and a plurality (two pieces) of second pedestal base layers 90B that are circumferential end portions of the plurality of second through holes 22C.

A plurality (two pieces) of front-side element mounting portions 28 are disposed at the rear side with respect to the slider mounting portion 22 at spaced intervals to each other in the right-left direction. The front-side element mounting portions 28 have generally rectangular shapes in plane view and protrude toward the rear side continuously from the end portion in the right-left direction at the rear end edge of the slider mounting portion 22. In this manner, the front-side element mounting portions 28 protrude toward the rear side with respect to the stage 15B and the lower surfaces of the front-side element mounting portions 28 are exposed from the metal supporting board 5. As shown in FIG. 4, the upper surfaces of the front-side element mounting portions 28 are flush with the upper surface of the slider mounting portion 22. The thickness of the front-side element mounting portion 28 is thinner than that of the slider mounting portion 22.

As shown in FIG. 2, the front-side element mounting portions 28 have front-side terminal openings 28A. The front-side terminal openings 28A have generally rectangular shapes in plane view and pass through the front-side element mounting portions 28 in the up-down direction.

The second mounting portion 23 is disposed at spaced intervals to the rear side of the first mounting portion 30 and integrally includes a base foundation portion 27 and rear-side element mounting portions 29.

The base foundation portion 27 is disposed at the front end portion on the upper surface of the foundation portion 15A and has a generally rectangular shape in plane view extending in the right-left direction. The front end edge of the base foundation portion 27 generally coincides with the front end edge of the foundation portion 15A as seen from the up-down direction.

A plurality (two pieces) of rear-side element mounting portions 29 are disposed at the front side with respect to the base foundation portion 27 at spaced intervals to each other in the right-left direction. The rear-side element mounting portions 29 correspond to the front-side element mounting portions 28 and are disposed at spaced intervals to the rear side of the respective front-side element mounting portions 28.

The rear-side element mounting portions 29 have generally rectangular shapes in plane view and protrude toward the front side continuously from the end portion in the right-left direction at the front end edge of the base foundation portion 27. In this manner, the rear-side element mounting portions 29 protrude toward the front side with respect to the foundation portion 15A and the lower surfaces of the rear-side element mounting portions 29 are exposed from the metal supporting board 5. The upper surfaces of the rear-side element mounting portions 29 are flush with the upper surface of the base foundation portion 27. The thickness of the rear-side element mounting portion 29 is thinner than that of the base foundation portion 27.

The rear-side element mounting portions 29 have rear-side terminal openings 29A. The rear-side terminal openings 29A have generally rectangular shapes in plane view and pass through the rear-side element mounting portions 29 in the up-down direction.

The base bridged portion 24 is disposed on the upper surface of the bridged portion 15C and is disposed between the slider mounting portion 22 and the base foundation portion 27 in the front-rear direction, and between the two pieces of front-side element mounting portions 28 in the right-left direction. The base bridged portion 24 has a generally rectangular shape in plane view extending in the front-rear direction. The base bridged portion 24 connects the slider mounting portion 22 to the base foundation portion 27 by connecting the front end portion of the base bridged portion 24 to the generally center in the right-left direction at the rear end edge of the slider mounting portion 22 and by connecting the rear end portion of the base bridged portion 24 to the generally center in the right-left direction at the front end edge of the base foundation portion 27.

The wire supporting portion 25 is disposed at the rear side of the base foundation portion 27. The wire supporting portion 25 extends toward the rear side continuously from the generally center in the right-left direction at the rear end edge of the base foundation portion 27 on the upper surface of the foundation portion 15A. Thereafter, the wire supporting portion 25 branches off into two ways to extend rearwardly at the rear side with respect to the foundation portion 15A.

The base connecting portion 26 is disposed at the front end portion of the base mounting portion 21. The base connecting portion 26 has flexibility and connects the front end portions of the outrigger portions 14 to the stage 15B.

The base wire portion (not shown) is disposed on the upper surface of the board wire portion 12 and the rear end portion of the wire supporting portion 25 is continuous to the front end portion thereof. The base connecting portion (not shown) is disposed on the upper surface of the board connecting portion 13 and the rear end portion of the base wire portion (not shown) is continuous to the front end portion thereof.

The base insulating layer 6 is, for example, formed of a synthetic resin such as polyimide resin, polyamide imide resin, acrylic resin, polyether resin, nitrile resin, polyether sulfone resin, polyethylene terephthalate resin, polyethylene naphthalate resin, and polyvinyl chloride resin. Preferably, the base insulating layer 6 is formed of polyimide resin.

The base insulating layer 6 has a thickness of, for example, 1 µm or more, or preferably 3 µm or more, and, for example 25 µm or less, or preferably 15 µm or less.

As shown in FIG. 4, the conductive pattern 7 is disposed on the upper surface of the base insulating layer 6. As shown in FIGS. 1 and 2, the conductive pattern 7 includes head-side terminals 71, piezoelectric-side terminals 72, external terminals 73, power source terminals 74, wires 75, and pedestal conductive layers 91.

As shown in FIG. 2, a plurality (four pieces) of head-side terminals 71 are disposed on the upper surface of the front end portion of the slider mounting portion 22 at spaced intervals to each other in the right-left direction. The head-side terminals 71 have generally rectangular shapes in plane view.

A plurality (four pieces) of piezoelectric-side terminals 72 are included, and the piezoelectric-side terminals 72 include first piezoelectric-side terminals 77 and second piezoelectric-side terminals 78.

One piece of first piezoelectric-side terminal 77 is disposed in each of the plurality of front-side element mounting portions 28. As shown in FIG. 4, the first piezoelectric-side terminals 77 fill the front-side terminal openings 28A. The lower surfaces of the first piezoelectric-side terminals 77 are flush with the lower surfaces of the front-side element mounting portions 28 in the front-rear and right-left directions.

As shown in FIG. 2, one piece of second piezoelectric-side terminal 78 is disposed in each of the plurality of rear-side element mounting portions 29. The second piezoelectric-side terminals 78 fill the rear-side terminal openings 29A. The lower surfaces of the second piezoelectric-side terminals 78 are flush with the lower surfaces of the rear-side element mounting portions 29 in the front-rear and right-left directions.

As shown in FIG. 1, a plurality (four pieces) of external terminals 73 are disposed at spaced intervals to each other in the front-rear direction in the external connecting portion 3 (to be more specific, the upper surface of the base connecting portion that is not shown). The external terminals 73 have generally rectangular shapes in plane view. The external terminals 73 are electrically connected to the external board 103.

A plurality (two pieces) of power source terminals 74 are disposed in the external connecting portion 3 (to be more specific, the upper surface of the base connecting portion that is not shown) so as to sandwich the plurality of external terminals 73 therebetween in the front-rear direction. The power source terminals 74 have generally rectangular shapes in plane view. The power source terminals 74 are electrically connected to the power sources 104.

As shown in FIG. 2, a plurality (six pieces) of wires 75 are included, and the wires 75 include a plurality (four pieces) of signal wires 79 and a plurality (two pieces) of power source wires 80.

The plurality of signal wires 79 electrically connect the plurality of head-side terminals 71 to the plurality of external terminals 73 (ref: FIG. 1). To be more specific, each of the plurality of signal wires 79 is appropriately wired around continuously from the front end portion of the corresponding head-side terminal 71 on the upper surface of the slider mounting portion 22. Thereafter, each of the plurality of signal wires 79 extends so as to sequentially pass over the base bridged portion 24, the base foundation portion 27, the wire supporting portion 25, and the base wire portion and the base connecting portion that are not shown to be then connected to the corresponding external terminal 73 (ref: FIG. 1).

The plurality of power source wires 80 electrically connect the plurality of second piezoelectric-side terminals 78 to the plurality of power source terminals 74 (ref: FIG. 1). To be more specific, each of the plurality of power source wires 80 extends toward the rear side continuously from the rear end portion of the corresponding second piezoelectric-side terminal 78 on the upper surface of the rear-side element mounting portion 29. Thereafter, each of the plurality of power source wires 80 extends so as to sequentially pass over the base foundation portion 27, the wire supporting portion 25, and the base wire portion and the base connecting portion that are not shown to be then connected to the corresponding power source terminal 74 (ref: FIG. 1).

A plurality (four pieces) of pedestal conductive layers 91 are disposed on the upper surface of the first mounting portion 30, and the pedestal conductive layers 91 include a plurality (two pieces) of first pedestal conductive layers 92 and a plurality (two pieces) of second pedestal conductive layers 93.

The plurality of first pedestal conductive layers 92 correspond to the plurality of first through holes 22B and are disposed at the generally central portion in the front-rear direction of the slider mounting portion 22 at spaced intervals to each other in the right-left direction. Each of the plurality of first pedestal conductive layers 92 has only a first circular portion 94 as one example of a fan portion in the first embodiment.

Figure 3:
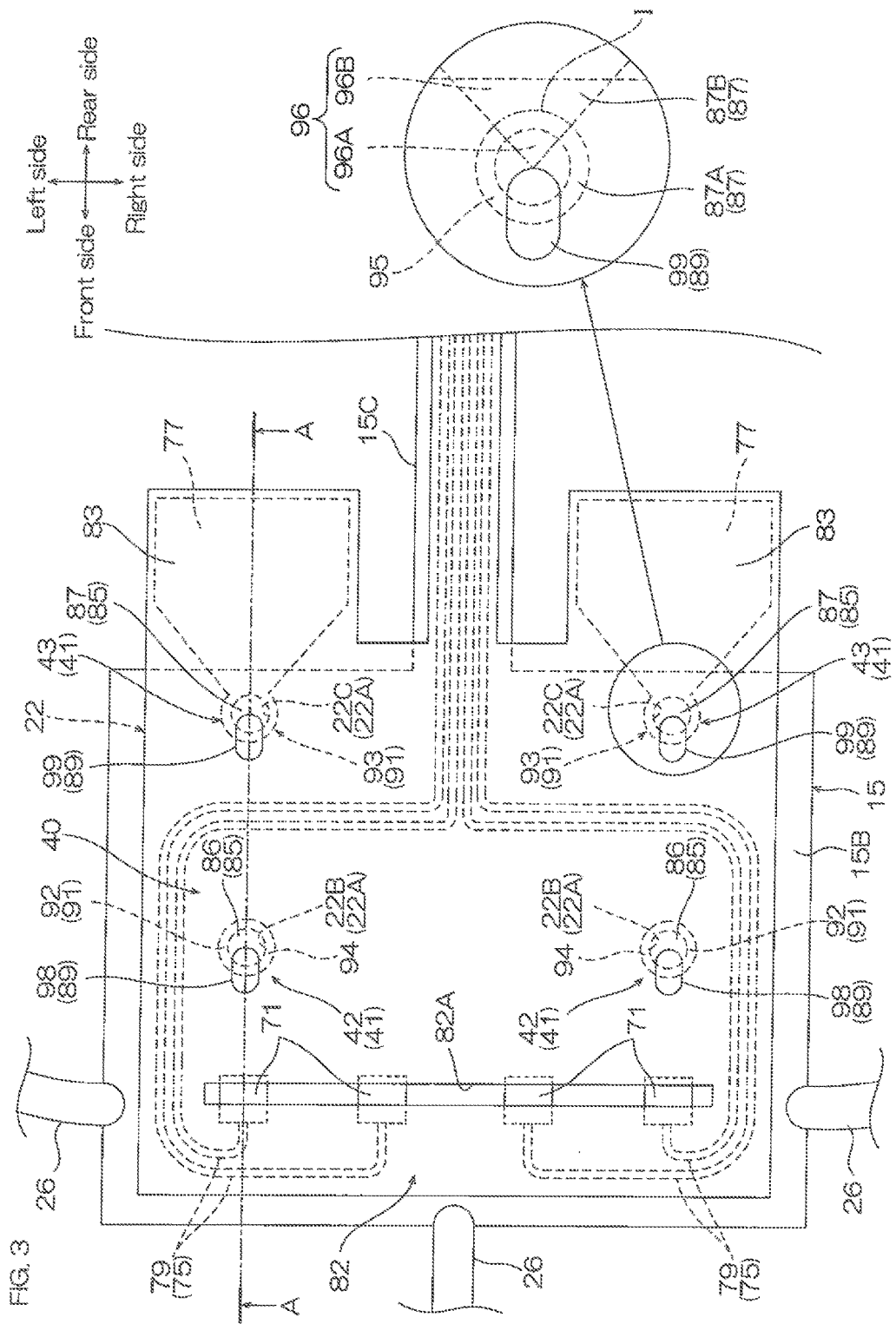
FIG. 3 shows an enlarged plan view of a slider mounting region shown in FIG. 2.

The first circular portion 94 has a generally circular shape in plane view. That is, the first circular portion 94 has a fan shape having the angle of the central angle of 360° and the entire circumferential end portion thereof has a circular shape (circular arc shape). As shown in FIGS. 3 and 4, the first circular portion 94 is disposed on the upper surface of the corresponding first pedestal base layer 90A so as to be overlapped with the first through hole 22B when viewed from above.

As shown in FIG. 4, the central portion of the first circular portion 94 fills the first through hole 22B. In this manner, the first circular portion 94 passes through the slider mounting portion 22 in the up-down direction and is in contact with the upper surface of the stage 15B that is exposed at the inside of the first through hole 22B. The central portion on the upper surface of the first circular portion 94 is dented downwardly.

As shown in FIG. 3, the plurality of second pedestal conductive layers 93 are disposed at the rear-side portion of the first mounting portion 30 at spaced intervals to each other in the right-left direction. The plurality of second pedestal conductive layers 93 are disposed at spaced intervals to the rear side of the plurality of first pedestal conductive layers 92 and are disposed at the front side of the plurality of first piezoelectric-side terminals 77. Each of the plurality of second pedestal conductive layers 93 integrally includes a fan portion 95 and a continuous portion 96.

The fan portion 95 has a generally fan shape in plane view having the angle of the central angle of generally 270° and has an opening rearwardly. That is, of the circumferential end portion of the fan portion 95, a portion having the angle of the central angle of generally 270° has a circular arc shape. The radius of curvature of the fan portion 95 is generally the same as the radius of the first circular portion 94.

The continuous portion 96 is disposed at the rear side of the fan portion 95 and connects the fan portion 95 to the first piezoelectric-side terminal 77. The continuous portion 96 has a generally triangular shape in plane view in which the width thereof is gradually widened toward the rear side. To be specific, the continuous portion 96 includes a summit portion 96A and a protruding portion 96B.

The summit portion 96A is disposed in a phantom circle I that shares the center with the fan portion 95. The summit portion 96A has a generally fan shape in plane view having the angle of the central angle of generally 90° and is continuous to the fan portion 95 in a circumferential direction. In this manner, the fan portion 95 and the summit portion 96A constitute a second circular portion 97 in a circular shape in plane view.

The second circular portion 97 (the fan portion 95 and the summit portion 96A) is disposed on the upper surface of the corresponding second pedestal base layer 90B so as to be overlapped with the second through hole 22C when viewed from above. As shown in FIG. 4, the central portion of the second circular portion 97 fills the second through hole 22C. In this manner, the second circular portion 97 passes through the slider mounting portion 22 in the up-down direction and is in contact with the upper surface of the stage 15B that is exposed at the inside of the second through hole 22C. The central portion on the upper surface of the second circular portion 97 is dented downwardly.

As shown in FIG. 3, the protruding portion 96B protrudes toward the rear side with respect to the phantom circle I of the fan portion 95 continuously from the summit portion 96A. That is, the protruding portion 96B protrudes outwardly in a radial direction of the phantom circle I with respect to the phantom circle I of the fan portion 95. The size in the right-left direction of the protruding portion 96B is gradually increased toward the rear side.

The rear end portion of the protruding portion 96B is connected to the front end portion of the corresponding first piezoelectric-side terminal 77. In this manner, the first piezoelectric-side terminal 77 is grounded to the stage 15B via the second pedestal conductive layer 93.

The conductive pattern 7 is, for example, formed of a conductive material such as copper, nickel, gold, and solder or an alloy thereof. Preferably, the conductive pattern 7 is formed of copper.

The conductive pattern 7 has a thickness of, for example, 1 μm or more, or preferably 3 μm or more, and, for example, 20 μm or less, or preferably 12 μm or less.

As referred to FIGS. 1 and 3, the cover insulating layer 8 is disposed on the upper surface of the base insulating layer 6 so as to cover the conductive pattern 7 from above over the mounted portion 2, the external connecting portion 3, and the wire portion 4. As shown in FIG. 3, the cover insulating layer 8 includes a mounting region cover 81.

The mounting region cover 81 is disposed on the upper surface of the first mounting portion 30 and integrally includes a slider mounting cover 82 and an element mounting cover 83.

The slider mounting cover 82 is disposed on the upper surface of the slider mounting portion 22 and covers the plurality of head-side terminals 71, the plurality of pedestal conductive layers 91, and the plurality of signal wires 79 that are disposed on the slider mounting portion 22. The slider mounting cover 82 has a terminal opening 82A.

The terminal opening 82A is disposed at the front end portion of the slider mounting cover 82 so as to be overlapped with the generally central portions in the front-rear direction of all of the head-side terminals 71 when viewed from above. The terminal opening 82A has a generally rectangular shape in plane view extending in the right-left direction and passes through the slider mounting cover 82 in the up-down direction. In this manner, the generally central portions in the front-rear direction of the head-side terminals 71 are exposed from the slider mounting cover 82 via the terminal opening 82A.

The slider mounting cover 82 includes pedestal cover layers 85 that are disposed on the upper surfaces of the pedestal conductive layers 91, to be more specific, a plurality (four pieces) of pedestal cover layers 85 corresponding to the plurality of pedestal conductive layers 91.

The plurality of pedestal cover layers 85 have a plurality (two pieces) of first pedestal cover layers 86 and a plurality (two pieces) of second pedestal cover layers 87.

Each of the plurality of first pedestal cover layers 86 is disposed on the upper surface of the corresponding first pedestal conductive layer 92 (the first circular portion 94). The first pedestal cover layer 86 has generally the same shape as the first circular portion 94 and has a generally circular shape in plane view.

As shown in FIG. 4, the thickness of the cover insulating layer 8 depends on the area of the conductive pattern 7 that is covered with the cover insulating layer 8. The first circular portion 94 has the circular shape, so that the thickness of the first pedestal cover layer 86 that is disposed on the upper surface of the first circular portion 94 is entirely constant. To be more specific, the first pedestal cover layer 86 has a thickness of, for example, 1 μm or more, or preferably 2 μm or more, and, for example, 10 μm or less, or preferably 8 μm or less. The central portion of the first pedestal cover layer 86 is dented downwardly corresponding to the dent in the upper surface of the first circular portion 94.

As shown in FIG. 3, each of the plurality of second pedestal cover layers 87 has generally the same shape as the corresponding second pedestal conductive layer 93 in plane view and is disposed on the upper surface of the second pedestal conductive layer 93 (the fan portion 95 and the continuous portion 96) thereof. The second pedestal cover layer 87 includes a thin portion 87A that is disposed on the upper surface of the fan portion 95 and is relatively thin and a thick portion 87B that is disposed on the upper surface of the continuous portion 96 and is relatively thick.

The thin portion 87A has generally the same shape as the fan portion 95 and has a generally fan shape in plane view having the angle of the central angle of generally 270°.

As shown in FIG. 4, the radius of curvature of the fan portion 95 is generally the same as that of the first circular portion 94, so that the thickness of the thin portion 87A is generally the same as that of the first pedestal cover layer 86. To be more specific, the ratio of the thickness of the thin portion 87A with respect to that of the first pedestal cover layer 86 is, for example, 0.7 or more and 1.3 or less, or preferably 1.

As shown in FIG. 3, the thick portion 87B has generally the same shape as the continuous portion 96 and has a generally triangular shape in plane view in which the width thereof is gradually widened toward the rear side. The front end portion (summit portion) of the thick portion 87B is disposed on the upper surface of the summit portion 96A of the continuous portion 96 and is continuous to the thin portion 87A in the circumferential direction. The rear-side portion of the thick portion 87B is disposed on the upper surface of the protruding portion 96B of the continuous portion 96.

The width of the continuous portion 96 is gradually widened toward the rear side (ref: FIG. 3), so that the thickness of the thick portion 87B gradually becomes thick toward the rear side. Thus, the upper surface of the thick portion 87B gradually inclines upwardly toward the rear side.

The front end portion of the thick portion 87B has a thickness of, for example, 1 μm or more, or preferably 2 μm or more, and, for example, 10 μm or less, or preferably 8 μm or less. The thickness of the rear end portion of the thick portion 87B (the maximum thickness of the thick portion 87B) with respect to the thickness of the thin portion 87A is, for example, 110% or more, or preferably 120% or more, and, for example, 300% or less, or preferably 200% or less. To be specific, the rear end portion of the thick portion 87B has a thickness (the maximum thickness of the thick portion 87B) of, for example, 1.5 μm or more, or preferably 3 μm or more, and, for example, 20 μm or less, or preferably 15 μm or less.

As shown in FIG. 3, one piece of element mounting cover 83 is disposed on the upper surface of each of the plurality of front-side element mounting portions 28 and covers the corresponding first piezoelectric-side terminal 77 from above. The front end portion of the element mounting cover 83 is connected to the rear end portion of the thick portion 87B of the corresponding second pedestal cover layer 87.

The cover insulating layer 8 is formed of the same synthetic resin as that of the base insulating layer 6. Preferably, the cover insulating layer 8 is formed of polyimide resin. The thickness of the cover insulating layer 8 is appropriately set.

As shown in FIGS. 3 and 4, the supporting layer 9 is disposed on the upper surface of the slider mounting portion 22 and includes a plurality (four pieces) of pedestal supporting layers 89.

The plurality of pedestal supporting layers 89 have the same shapes to each other as seen from the up-down direction and have generally elliptical shapes in plane view extending in the front-rear direction.

The plurality of pedestal supporting layers 89 include a plurality (two pieces) of first pedestal supporting layers 98 and a plurality (two pieces) of second pedestal supporting layers 99.

One piece of the plurality of first pedestal supporting layers 98 corresponds to one piece of the plurality of first pedestal cover layers 86. The plurality of first pedestal supporting layers 98 are disposed at the generally central portion in the front-rear direction of the slider mounting cover 82 at spaced intervals to each other in the right-left direction. To be more specific, each of the plurality of first pedestal supporting layers 98 is disposed so as to traverse the front end edge (circumferential edge) of the first circular portion 94 as seen from the up-down direction. In this manner, the rear-side portion of the first pedestal supporting layer 98 is disposed on the upper surface of the first pedestal cover layer 86 so as to be overlapped with the first circular portion 94 in the up-down direction, and the front-side portion of the first pedestal supporting layer 98 is positioned at the front side with respect to the first pedestal cover layer 86 so as not to be overlapped with the first circular portion 94 in the up-down direction.

One piece of the plurality of second pedestal supporting layers 99 corresponds to one piece of the plurality of second pedestal cover layers 87. The plurality of second pedestal supporting layers 99 are disposed at the rear end portion of the slider mounting cover 82 at spaced intervals to each other in the right-left direction. To be more specific, each of the plurality of second pedestal supporting layers 99 is disposed so as to traverse the front end edge (circumferential edge) of the fan portion 95 as seen from the up-down direction. In this manner, the rear-side portion of the second pedestal supporting layer 99 is disposed on the upper surface of the thin portion 87A so as to be overlapped with the fan portion 95 in the up-down direction, and the front-side portion of the second pedestal supporting layer 99 is positioned at the front side with respect to the second pedestal cover layer 87 so as not to be overlapped with the fan portion 95 in the up-down direction. That is, the second pedestal supporting layer 99 is disposed so as not to be overlapped with the continuous portion 96 in the up-down direction.

The supporting layer 9 is formed of the same synthetic resin as that of the base insulating layer 6, a metal material, or the like. Preferably, the supporting layer 9 is formed of a synthetic resin. The supporting layer 9 has a thickness of, for example, 1 μm or more, or preferably 2 μm or more, and, for example, 10 μm or less, or preferably 8 μm or less.

As shown in FIG. 4, the suspension board with circuit 1 includes a slider mounting region 40 on which the slider 100 is mounted.

As shown in FIGS. 3 and 4, the slider mounting region 40 includes (consists of) the stage 15B, the slider mounting portion 22, the conductive pattern 7 (the plurality of head-side terminals 71, the front-side portions of the plurality of signal wires 79, and the plurality of pedestal conductive layers 91) that is disposed on the slider mounting portion 22, and the slider mounting cover 82.

The slider mounting region 40 includes a pedestal unit 41 as one example of a supporting portion for supporting the slider 100.

As shown in FIG. 3, the pedestal unit 41 includes first pedestals 42 and second pedestals 43 that are disposed at spaced intervals to each other in the front-rear direction. A plurality (two pieces) of first pedestals 42 and a plurality (two pieces) of second pedestals 43 are disposed in spaced apart relation in the right-left direction. That is, the pedestal unit 41 includes two pieces of first pedestals 42 and two pieces of second pedestals 43. The first pedestal 42 and the second pedestal 43 are one example of one pair of pedestals, while the first pedestal 42 is one example of the other pedestal and the second pedestal 43 is one example of one pedestal.

As shown in FIG. 4, the first pedestal 42 includes (consists of) the first pedestal base layer 90A, the first pedestal conductive layer 92, the first pedestal cover layer 86, and the first pedestal supporting layer 98.

The first pedestal 42 has a height (thickness) of, for example, 10 μm or more, or preferably 12 μm or more, and, for example, 50 μm or less, or preferably 45 μm or less. The height of the first pedestal 42 is a distance from the upper surface of the stage 15B to the uppermost end portion of the first pedestal supporting layer 98 along the up-down direction.

The second pedestal 43 is disposed at spaced intervals to the rear side of the first pedestal 42. The second pedestal 43 includes (consists of) the second pedestal base layer 90B, the second pedestal conductive layer 93, the second pedestal cover layer 87, and the second pedestal supporting layer 99.

The height (thickness) of the second pedestal 43 is generally the same as the height of the first pedestal 42. To be more specific, the ratio of the height of the second pedestal 43 with respect to the height of the first pedestal 42 is, for example, 0.9 or more and 1.1 or less, or preferably 1. The height of the second pedestal 43 is a distance from the upper surface of the stage 15B to the uppermost end portion of the second pedestal supporting layer 99 along the up-down direction.

The suspension board with circuit 1 can be, for example, produced by a known producing method disclosed in Japanese Unexamined Patent Publication No. 2012-99204.

A varnish that contains a synthetic resin having photosensitivity is, for example, applied onto the metal supporting board 5 to be then dried. Thereafter, the applied varnish is exposed to light (subjected to gradation exposure to light as needed) and developed, thereby forming the base insulating layer 6 in the above-described pattern.

Next, the conductive pattern 7 is, for example, formed into the above-described pattern by an additive method or a subtractive method. Thereafter, for example, a varnish that contains a synthetic resin having photosensitivity is applied onto the base insulating layer 6 and the conductive pattern 7 to be then dried. Thereafter, the applied varnish is exposed to light and developed, thereby forming the cover insulating layer 8 in the above-described pattern.

Next, the supporting layer 9 in the above-described pattern is formed on the cover insulating layer 8 by a known forming method.

Next, the metal supporting board 5 is trimmed and thereafter, an unnecessary portion of the base insulating layer 6 is removed as needed.

In the above-described manner, the suspension board with circuit 1 is produced.

The slider 100 and a plurality (two pieces) of piezoelectric elements 102 are mounted on the suspension board with circuit 1.

The slider 100 has a generally flat plate shape having a thickness in the up-down direction. The magnetic head 101 of the slider 100 is disposed at the front end portion of the slider 100.

The piezoelectric elements 102 are actuators that are capable of stretching and shrinking in the front-rear direction. Electricity is supplied and the voltage thereof is controlled and in this way, the piezoelectric elements 102 stretch and shrink. The piezoelectric elements 102 include electrodes that are not shown.

To mount the slider 100 and the piezoelectric elements 102 on the suspension board with circuit 1, first, an electrically conductive bonding agent 44 is disposed on the upper surfaces of the head-side terminals 71 and the lower surfaces of the piezoelectric-side terminals 72. The electrically conductive bonding agent 44 is, for example, prepared from an electrically conductive material such as solder having a low melting point or an electrically conductive adhesive.

Next, an adhesive that is not shown is disposed at the generally central portion on the upper surface of the slider mounting cover 82.

Then, the slider 100 is mounted on the slider mounting region 40 from above. Then, the lower surface of the slider 100 is brought into contact with the upper surfaces of the first pedestal supporting layers 98 of the first pedestals 42 and the upper surfaces of the second pedestal supporting layers 99 of the second pedestals 43 from the lower side thereof. In this manner, the slider 100 is supported by the pedestal unit 41.

The central portion on the lower surface of the slider 100 is fixed to the slider mounting region 40 by an adhesive that is not shown.

Thereafter, the magnetic head 101 is electrically connected to the head-side terminals 71 via the electrically conductive bonding agent 44.

The piezoelectric elements 102 are mounted on the front-side element mounting portions 28 and the rear-side element mounting portions 29 from the lower sides thereof. In this manner, the piezoelectric elements 102 are disposed between the foundation portion 15A and the stage 15B.

Thereafter, the electrodes of the piezoelectric elements 102 are electrically connected to the piezoelectric-side terminals 72 via the electrically conductive bonding agent 44.

In this manner, the mounting operation of the slider 100 and the piezoelectric elements 102 on the suspension board with circuit 1 is completed.

As shown in FIG. 4, in the suspension board with circuit 1, the first pedestal conductive layer 92 of the first pedestal 42 has only the first circular portion 94. Thus, the first pedestal cover layer 86 of the first pedestal 42 covers only the first circular portion 94.

The second pedestal conductive layer 93 of the second pedestal 43 has the fan portion 95 and the continuous portion 96 having the summit portion 96A and the protruding portion 96B. Thus, the second pedestal cover layer 87 of the second pedestal 43 has the thin portion 87A covering the fan portion 95 and the thick portion 87B covering the continuous portion 96. The thickness of the thin portion 87A is generally the same as that of the first pedestal cover layer 86. The thickness of the thick portion 87B is larger than that of the first pedestal cover layer 86.

Figure 10:
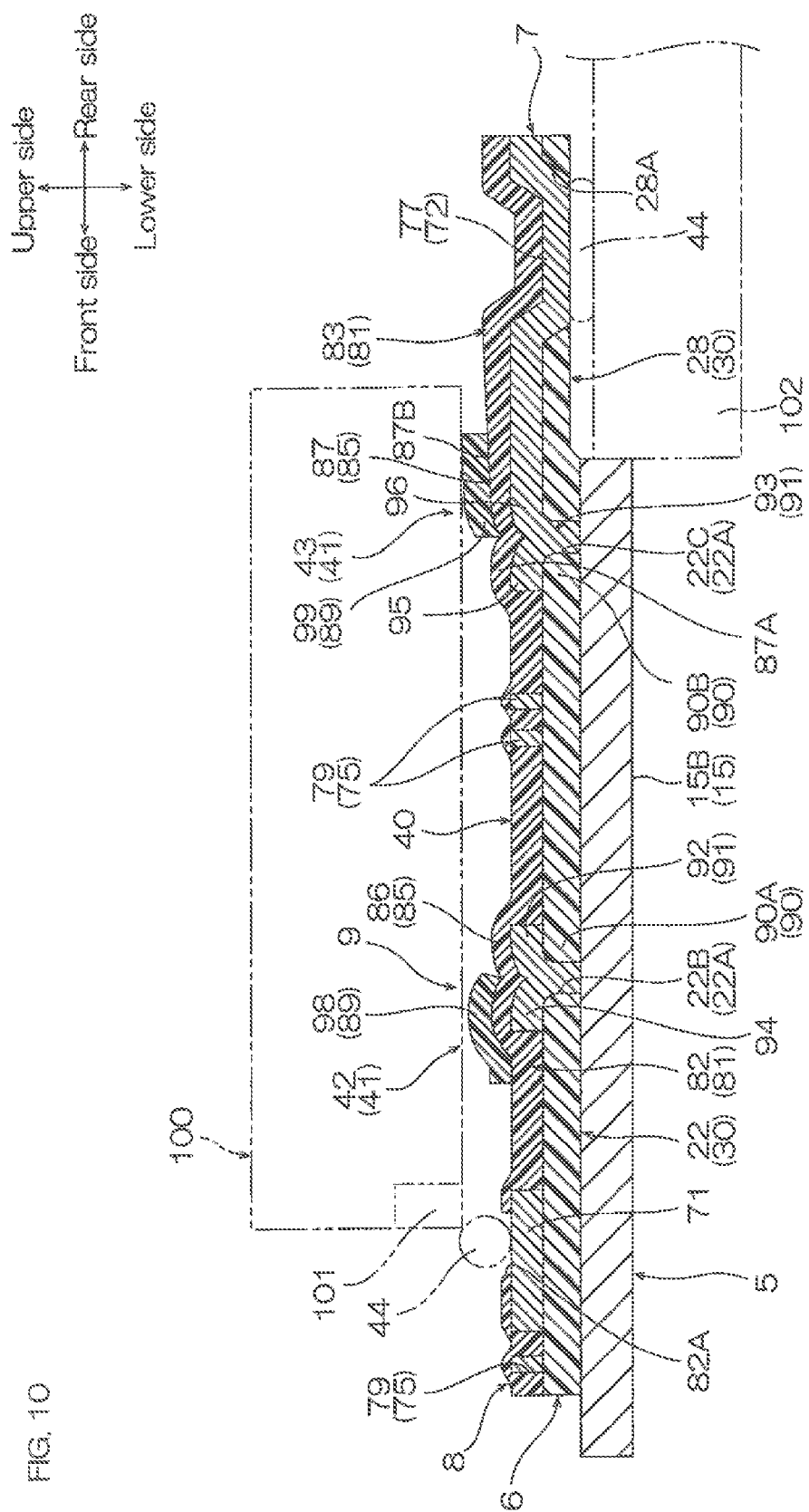
FIG. 10 shows a sectional view corresponding to an A-A section shown in FIG. 3 and an explanatory view for illustrating a case where a second pedestal supporting layer of a second pedestal shown in FIG. 4 is disposed so as to be overlapped with a continuous portion in an up-down direction.

As shown in FIG. 10, in such a structure, when the first pedestal supporting layer 98 of the first pedestal 42 is disposed on the upper surface of the first pedestal cover layer 86 and the second pedestal supporting layer 99 of the second pedestal 43 is disposed on the upper surface of the thick portion 87B of the second pedestal cover layer 87, the height of the first pedestal 42 is lower than that of the second pedestal 43 caused by a difference in thickness between the first pedestal cover layer 86 and the thick portion 87B.

Thus, unevenness of the height (size in the up-down direction) of each of the first pedestal 42 and the second pedestal 43 occurs and the slider 100 cannot be accurately supported.

Meanwhile, as shown in FIG. 4, in the first embodiment, the first pedestal supporting layer 98 of the first pedestal 42 is disposed on the upper surface of the first pedestal cover layer 86 so as to be overlapped with the first circular portion 94 in the up-down direction, while the second pedestal supporting layer 99 of the second pedestal 43 is disposed on the upper surface of the thin portion 87A of the second pedestal cover layer 87 so as to be overlapped with the fan portion 95 and so as not to be overlapped with the continuous portion 96 in the up-down direction.

That is, the pedestal supporting layer 89 (the first pedestal supporting layer 98 and the second pedestal supporting layer 99) is locally disposed in a relatively thin portion in the pedestal cover layer 85 without being disposed in a relatively thick portion in the pedestal cover layer 85 in each of the first pedestal 42 and the second pedestal 43.

Thus, unevenness of the height of the first pedestal 42 and the second pedestal 43 can be suppressed and accordingly, the height of the first pedestal 42 and the second pedestal 43 can be generally the same.

As a result, the first pedestal 42 and the second pedestal 43 can accurately support the slider 100 and the position accuracy of the slider 100 in the up-down direction can be improved.

As shown in FIG. 3, the pedestal unit 41 includes the plurality of first pedestals 42 and the plurality of second pedestals 43. Thus, the pedestal unit 41 can stably support the slider 100.

As shown in FIG. 3, all of the pedestal supporting layers 89 have the same shapes to each other as seen from the up-down direction. Thus, unevenness of the height of each of the first pedestals 42 and each of the second pedestals 43 can be suppressed, and the position accuracy of the slider 100 in the up-down direction can be further improved.

2. Second Embodiment

Next, a second embodiment of the present invention is described with reference to FIGS. 5 to 6. In the second embodiment, the same reference numerals are provided for members corresponding to each of those in the above-described first embodiment, and their detailed description is omitted.

As shown in FIG. 3, in the first embodiment, the first pedestal conductive layer 92 of the first pedestal 42 has only the first circular portion 94. However, the structure is not limited to this.

Figure 5:
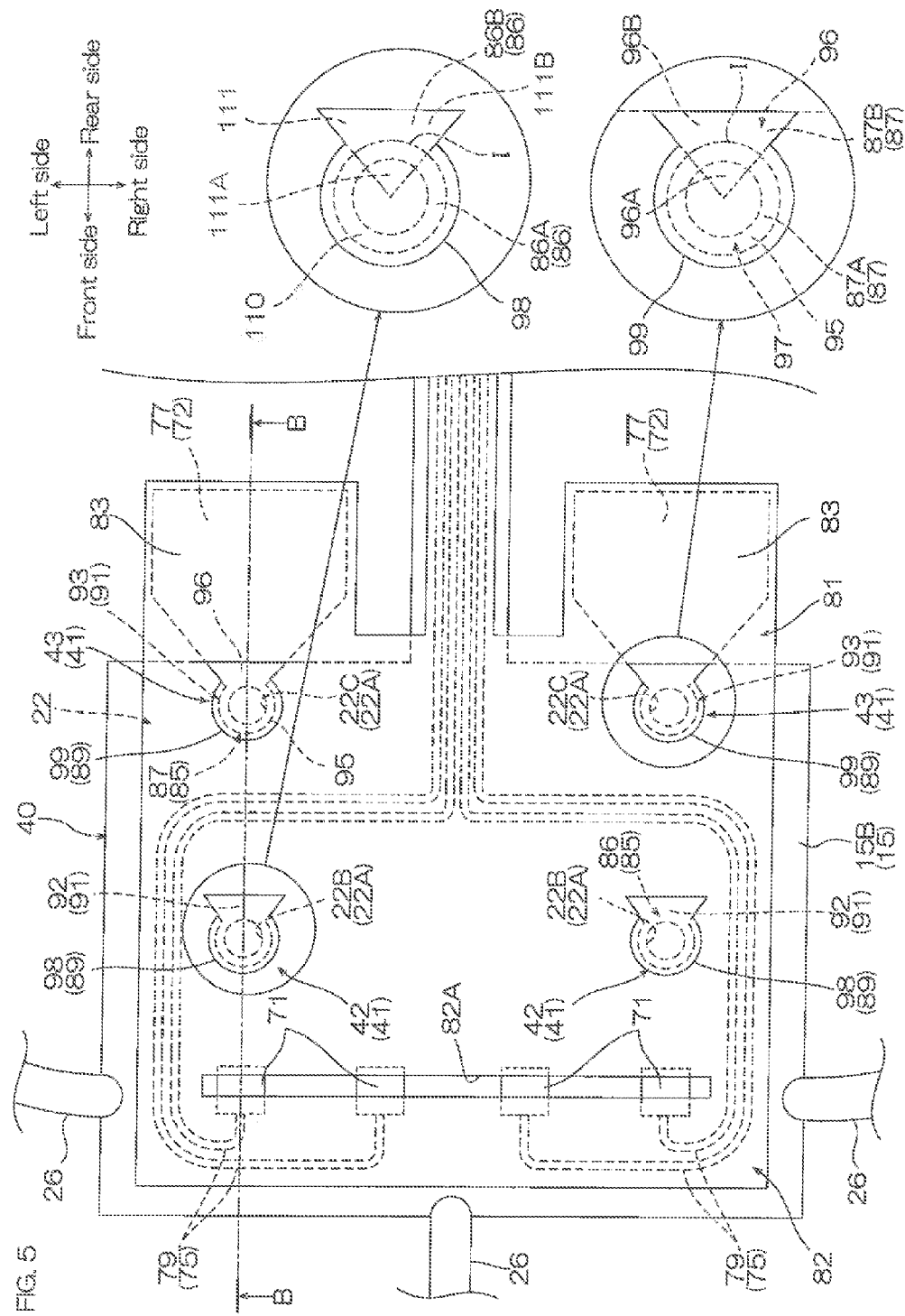
FIG. 5 shows an enlarged plan view of a slider mounting region according to a second embodiment of a suspension board with circuit of the present invention.

As shown in FIG. 5, in the second embodiment, the first pedestal conductive layer 92 integrally includes a first fan portion 110 and a first continuous portion 111. In the second embodiment, the fan portion 95 included in the second pedestal conductive layer 93 is defined as a second fan portion 95, and the continuous portion 96 included in the second pedestal conductive layer 93 is defined as a second continuous portion 96.

The first fan portion 110 has the same shape and size as the second fan portion 95. To be specific, the first fan portion 110 has a generally fan shape in plane view having the angle of the central angle of generally 270° and has an opening rearwardly.

The first continuous portion 111 is disposed at the rear side of the first fan portion 110. The first continuous portion 111 has a generally triangular shape in plane view in which the width thereof is gradually widened toward the rear side. To be specific, the first continuous portion 111 includes a summit portion 111A and a protruding portion 111B.

The summit portion 111A is disposed in the phantom circle I that shares the center with the first fan portion 110. The summit portion 111A has a generally fan shape in plane view having the angle of the central angle of generally 90° and is continuous to the first fan portion 110 in the circumferential direction. In this manner, the first fan portion 110 and the summit portion 111A constitute the first circular portion 94 in a circular shape in plane view.

The protruding portion 111B protrudes toward the rear side with respect to the phantom circle I of the first fan portion 110 continuously from the summit portion 111A. The protruding portion 111B has the same shape and size as the front-side portion of the protruding portion 96B of the second continuous portion 96. That is, the area of the protruding portion 111B generally coincides with the area of the front-side portion (continuous portion of the summit portion 96A) of the protruding portion 96B.

Figure 6:
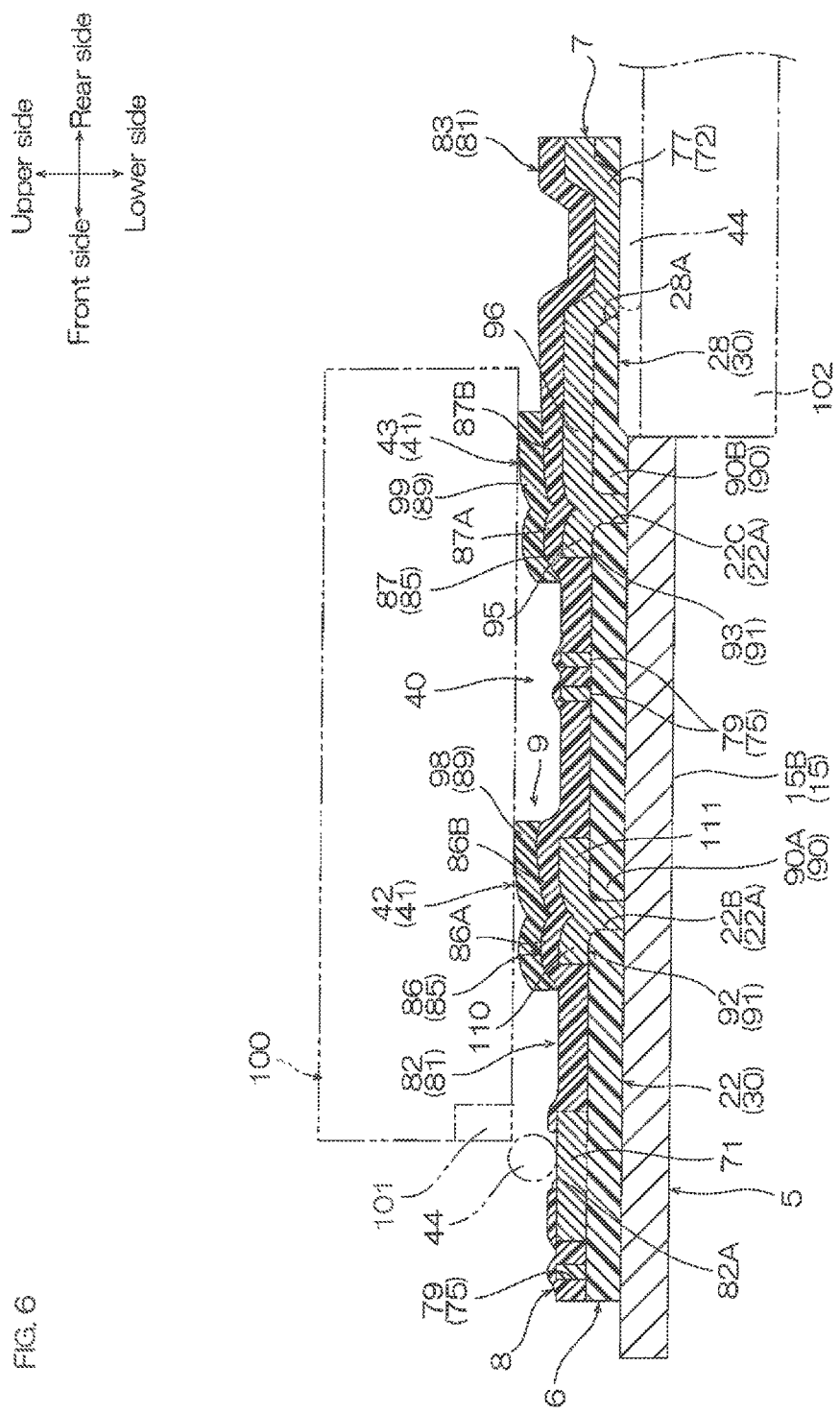
FIG. 6 shows a B-B sectional view of the slider mounting region shown in FIG. 5.

As shown in FIG. 6, the first pedestal cover layer 86 of the first pedestal 42 has generally the same shape as the first pedestal conductive layer 92 in plane view and includes a thin portion 86A that is disposed on the upper surface of the first fan portion 110 and a thick portion 86B that is disposed on the upper surface of the first continuous portion 111.

The first fan portion 110 has the same shape and size as the second fan portion 95, so that the thickness of the thin portion 86A is generally the same as that of the thin portion 87A of the second pedestal cover layer 87.

The thick portion 86B is thicker than the thin portion 86A. The width of the first continuous portion 111 is gradually widened toward the rear side (ref: FIG. 5), so that the thickness of the thick portion 86B gradually becomes thick toward the rear side. Thus, the upper surface of the thick portion 86B gradually inclines upwardly toward the rear side. The thickness of the front end portion of the thick portion 86B is the same as that of the front end portion of the thick portion 87B, and the inclination angle of the upper surface of the thick portion 86B is generally the same as that of the upper surface of the thick portion 87B.

As shown in FIG. 5, the first pedestal supporting layer 98 of the first pedestal 42 has generally the same shape as the first pedestal conductive layer 92 in plane view. The first pedestal supporting layer 98 is disposed on the upper surface of the first pedestal cover layer 86 so as to be overlapped with the first pedestal conductive layer 92 in the up-down direction.

That is, as shown in FIG. 6, the rear-side portion of the first pedestal supporting layer 98 is disposed on the upper surface of the thick portion 86B of the first pedestal cover layer 86 so as to be overlapped with the first continuous portion 111 of the first pedestal conductive layer 92 in the up-down direction. The front-side portion of the first pedestal supporting layer 98 is disposed on the upper surface of the thin portion 86A of the first pedestal cover layer 86 so as to be overlapped with the first fan portion 110 of the first pedestal conductive layer 92 in the up-down direction.

As shown in FIG. 5, the second pedestal supporting layer 99 of the second pedestal 43 has generally the same shape as the first pedestal supporting layer 98 and is disposed on the upper surface of the second pedestal cover layer 87 so as to be overlapped with the second pedestal conductive layer 93 in the up-down direction.

That is, as shown in FIG. 6, the rear-side portion of the second pedestal supporting layer 99 is disposed on the upper surface of the thick portion 87B of the second pedestal cover layer 87 so as to be overlapped with the front-side portion of the second continuous portion 96 of the second pedestal conductive layer 93 in the up-down direction. The front-side portion of the second pedestal supporting layer 99 is disposed on the upper surface of the thin portion 87A of the second pedestal cover layer 87 so as to be overlapped with the second fan portion 95 of the second pedestal conductive layer 93 in the up-down direction.

The first pedestal 42 has a height (thickness) of, for example, 12 μm or more, or preferably 15 μm or more, and, for example, 55 μm or less, or preferably 50 μm or less. The height (thickness) of the second pedestal 43 is generally the same as the height of the first pedestal 42.

According to the second embodiment, the rear-side portion of the first pedestal supporting layer 98 is disposed on the upper surface of the thick portion 86B of the first pedestal cover layer 86 so as to be overlapped with the first continuous portion 111 of the first pedestal conductive layer 92 in the up-down direction.

The rear-side portion of the second pedestal supporting layer 99 is disposed on the upper surface of the thick portion 87B of the second pedestal cover layer 87 so as to be overlapped with the second continuous portion 96 of the second pedestal conductive layer 93 in the up-down direction.

That is, the pedestal supporting layer 89 (the first pedestal supporting layer 98 and the second pedestal supporting layer 99) is disposed in a relatively thick portion in the pedestal cover layer 85 in each of the first pedestal 42 and the second pedestal 43.

Thus, unevenness of the height of the first pedestal 42 and the second pedestal 43 can be suppressed and accordingly, the height of the first pedestal 42 and the second pedestal 43 can be generally the same.

As a result, the slider 100 can be supported by the highest portion of the first pedestal 42 and the second pedestal 43, which have generally the same height, so that the position accuracy of the slider 100 in the up-down direction can be improved.

Accordingly, in the second embodiment, the same function and effect as that of the first embodiment can be achieved.

3. Third Embodiment

Next, a third embodiment of the present invention is described with reference to FIG. 7. In the third embodiment, the same reference numerals are provided for members corresponding to each of those in the above-described first and second embodiments, and their detailed description is omitted.

As shown in FIG. 6, in the second embodiment, the first pedestal supporting layer 98 is disposed so as to be overlapped with the first continuous portion 111 of the first pedestal conductive layer 92 in the up-down direction, and the second pedestal supporting layer 99 is disposed so as to be overlapped with the second continuous portion 96 of the second pedestal conductive layer 93 in the up-down direction.

Figure 7:
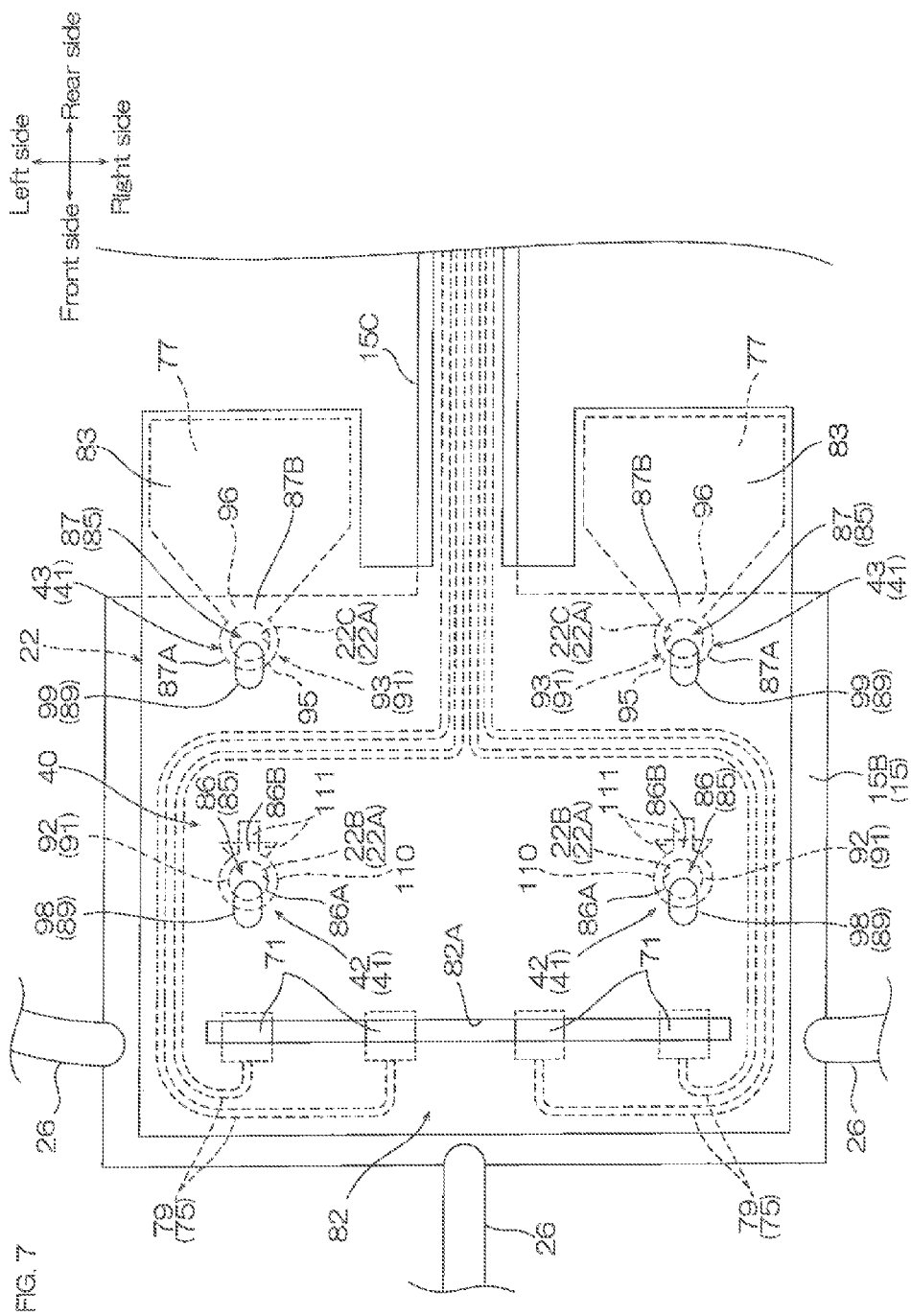
FIG. 7 shows an enlarged plan view of a slider mounting region according to a third embodiment of a suspension board with circuit of the present invention.

On the contrary, as shown in FIG. 7, in the third embodiment, the first pedestal supporting layer 98 is disposed so as to be overlapped with the first fan portion 110 of the first pedestal conductive layer 92 and so as not to be overlapped with the first continuous portion 111 in the up-down direction, and the second pedestal supporting layer 99 is disposed so as to be overlapped with the second fan portion 95 of the second pedestal conductive layer 93 and so as not to be overlapped with the second continuous portion 96 in the up-down direction.

To be more specific, each of the first pedestal supporting layer 98 and the second pedestal supporting layer 99 has a generally elliptical shape in plane view in the same manner as that in the first embodiment. The first pedestal supporting layer 98 is disposed so as to traverse the front end edge of the first continuous portion 111 as seen from the up-down direction. In this manner, the rear-side portion of the first pedestal supporting layer 98 is disposed on the upper surface of the thin portion 86A of the first pedestal cover layer 86 so as to be overlapped with the first fan portion 110 in the up-down direction, and the front-side portion of the first pedestal supporting layer 98 is disposed at the front side with respect to the first pedestal cover layer 86 so as not to be overlapped with the first fan portion 110 in the up-down direction.

That is, the first pedestal supporting layer 98 is disposed so as to be overlapped with the first fan portion 110 and so as not to be overlapped with the first continuous portion 111 in the up-down direction.

The second pedestal supporting layer 99 is disposed so as to be overlapped with the second fan portion 95 and so as not to be overlapped with the second continuous portion 96 in the up-down direction in the same manner as that in the first embodiment.

According to the third embodiment, the pedestal supporting layer 89 (the first pedestal supporting layer 98 and the second pedestal supporting layer 99) is locally disposed in a relatively thin portion in the pedestal cover layer 85 without being disposed in a relatively thick portion in the pedestal cover layer 85 in each of the first pedestal 42 and the second pedestal 43.

Thus, in the third embodiment, the same function and effect as that of the first and second embodiments can be achieved.

As shown by phantom lines in FIG. 7, when the angle of the central angle of the first fan portion 110 is different from that of the central angle of the second fan portion 95, and the area of the protruding portion 111B of the first continuous portion 111 is different from that of the front-side portion of the protruding portion 96B of the second continuous portion 96, the first pedestal supporting layer 98 is disposed so as to be overlapped with the first fan portion 110 and so as not to be overlapped with the first continuous portion 111 in the up-down direction, and the second pedestal supporting layer 99 is disposed so as to be overlapped with the second fan portion 95 and so as not to be overlapped with the second continuous portion 96 in the up-down direction in the same manner as that described above.

4. Modified Example

As shown in FIG. 3, in the first embodiment, each of the first pedestal supporting layer 98 and the second pedestal supporting layer 99 has an elliptical shape in plane view extending in the front-rear direction. However, the shape of the first pedestal supporting layer 98 and the second pedestal supporting layer 99 is not particularly limited. Examples of the shape thereof may include a circular shape, or as shown in FIG. 8, a polygonal shape.

As shown in FIG. 3, in the first embodiment, all of the pedestal supporting layers 89 have the same shapes as seen from the thickness direction. However, the shape thereof is not limited to this. The plurality of pedestal supporting layers 89 can have different shapes to each other.

Figure 8:
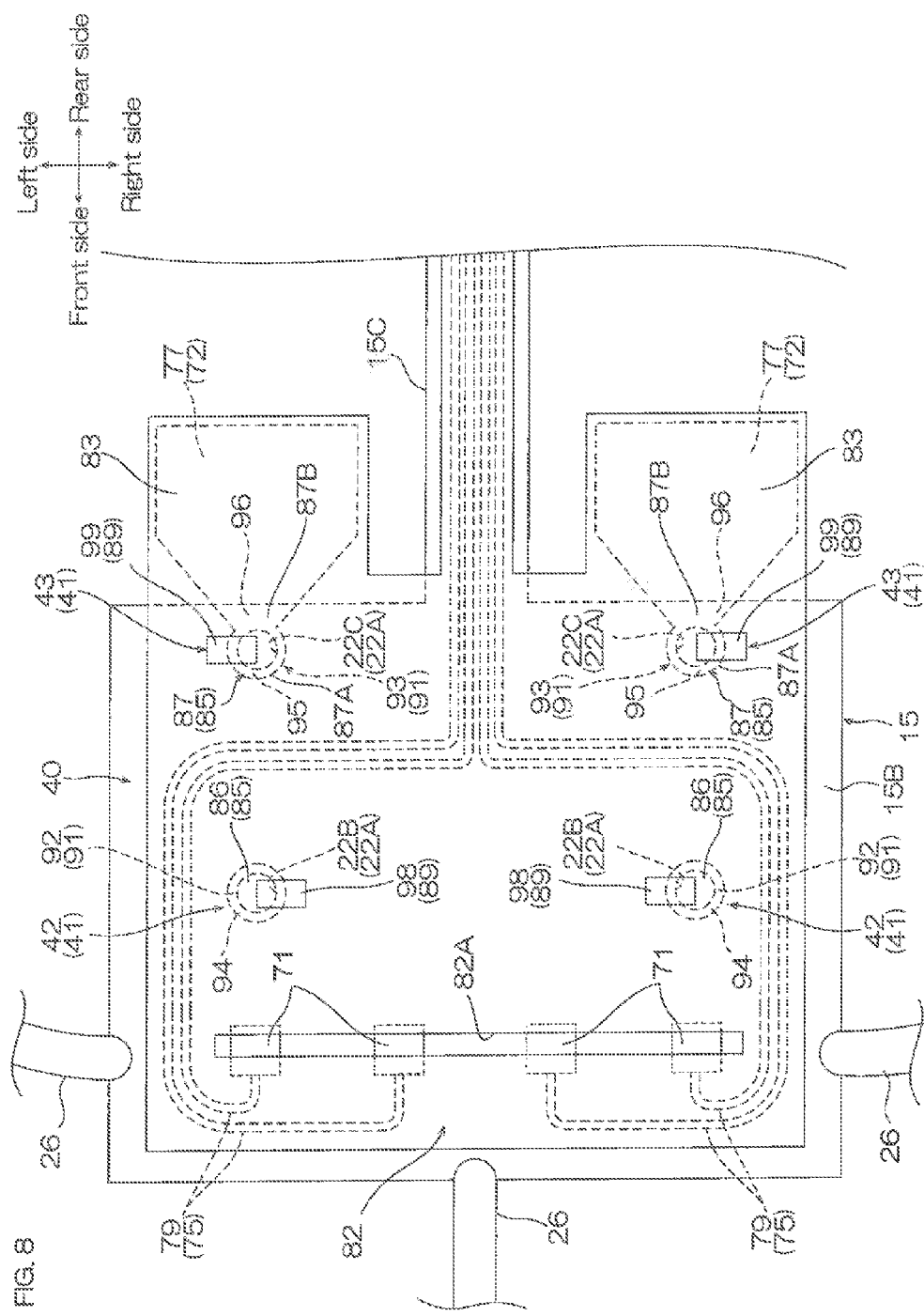
FIG. 8 shows an enlarged plan view of a slider mounting region according to a first modified example of a suspension board with circuit of the present invention.
Figure 9:
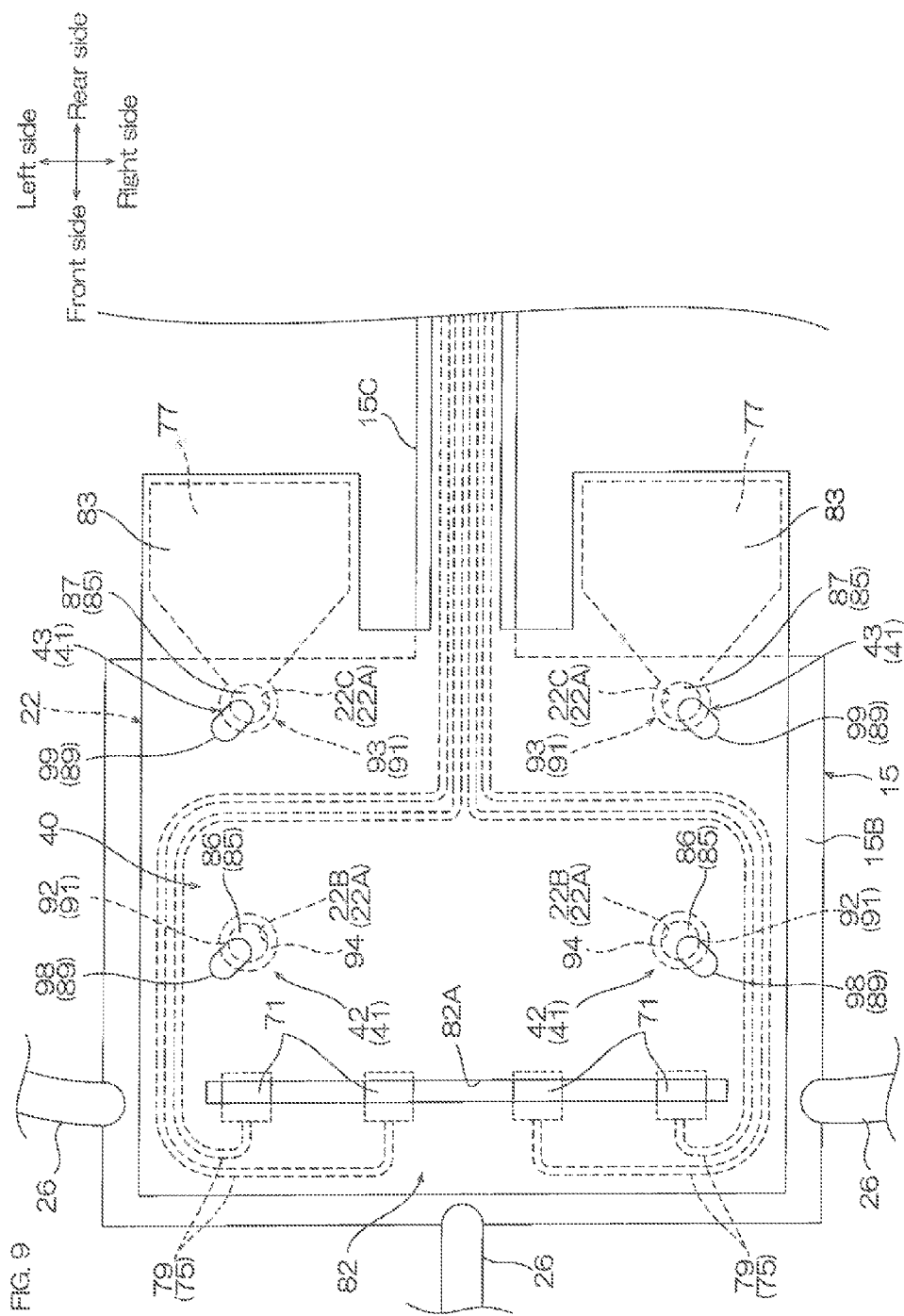
FIG. 9 shows an enlarged plan view of a slider mounting region according to a second modified example of a suspension board with circuit of the present invention.

As shown in FIGS. 8 and 9, the arrangement of the first pedestal supporting layer 98 is not particularly limited as long as the first pedestal supporting layer 98 is overlapped with the first circular portion 94 in the up-down direction. The arrangement of the second pedestal supporting layer 99 is not particularly limited as long as the second pedestal supporting layer 99 is overlapped with the fan portion 95 and is not overlapped with the continuous portion 96 in the up-down direction.

As shown in FIG. 9, for example, each of the first pedestal supporting layer 98 and the second pedestal supporting layer 99 can be also disposed so as to gradually incline outwardly in the right-left direction toward the front side. In such a case, the inclination of the first pedestal supporting layer 98 in the front-rear direction is generally the same as that of the second pedestal supporting layer 99 in the front-rear direction.

As shown in FIG. 8, each of the first pedestal supporting layer 98 and the second pedestal supporting layer 99 can be also disposed so as to be along the right-left direction.

In the first embodiment, the angle of the central angle of the fan portion 95 is generally 290°. However, the angle of the central angle of the fan portion 95 is not limited to this and can be appropriately changed in a range of, for example, 90° or more, or preferably 100° or more, and, for example, 350° or less, or preferably 340° or less.

As shown in FIG. 5, in the second embodiment, the first pedestal supporting layer 98 is disposed so as to be overlapped with the first fan portion 110 and the first continuous portion 111 in the up-down direction, and the second pedestal supporting layer 99 is disposed so as to be overlapped with the second fan portion 95 and the front-side portion of the second continuous portion 96 in the up-down direction. However, the arrangement is not limited to this.

Alternatively, the first pedestal supporting layer 98 can be also disposed so as to be overlapped with the first continuous portion 111 and so as not to be overlapped with the first fan portion 110 in the up-down direction, and the second pedestal supporting layer 99 can be also disposed so as to be overlapped with the second continuous portion 96 and so as not to be overlapped with the second fan portion 95 in the up-down direction.

In the modified examples, the same function and effect as that of the above-described first to third embodiments can be achieved. Each of the above-described first to third embodiments and the modified examples can be appropriately used in combination.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A suspension board with circuit including a supporting portion configured to support a slider and extending in a predetermined direction, comprising:
  a metal supporting board,
  a base insulating layer disposed at one surface of the metal supporting board,
  a conductive pattern disposed at one surface of the base insulating layer, a cover insulating layer disposed at the one surface of the base insulating layer so as to cover the conductive pattern, and a supporting layer disposed at one surface of the cover insulating layer, wherein the supporting portion includes at least one pair of pedestals, each of the at least one pair of pedestals spaced apart from each other in the predetermined direction, wherein a thickness direction crosses the predetermined direction and passes through the metal supporting board, the base insulating layer, the conductive pattern, the cover insulating layer and the supporting layer;

each of the at least one pair of pedestals is configured to support the slider, and includes a pedestal base layer included in the base insulating layer, a pedestal conductive layer included in the conductive pattern and disposed at one surface of the pedestal base layer, a pedestal cover layer included in the cover insulating layer and disposed at one surface of the pedestal conductive layer, and a pedestal supporting layer included in the supporting layer and disposed at one surface of the pedestal cover layer, wherein the thickness direction passes through the pedestal conductive layer, the pedestal cover layer and the supporting layer, each pair of the at least one pair of pedestals has a first pedestal and a second pedestal, each of the first and second pedestals has a fan portion, the pedestal conductive layer of the first pedestal has the fan portion in which at least a part of a circumferential end portion thereof has a circular arc shape and a continuous portion continuous from the fan portion in a circumferential direction thereof and having a protruding portion protruding outwardly in a radial direction of a phantom circle with respect to the phantom circle sharing a center with the fan portion; and the pedestal conductive layer of the second pedestal has only the fan portion, and as viewed in the thickness direction, the pedestal supporting layer is disposed so as to overlap with the fan portion in each pedestal of the at least one pair of pedestals and so as not to overlap with the continuous portion in the first pedestal.

2. The suspension board with circuit according to claim 1, wherein the at least one pair of pedestals is a plurality of pairs of pedestals, the supporting portion includes the plurality of pairs of pedestals with the pairs being at spaced intervals in a widthwise direction, the widthwise direction crosses the predetermined direction and the thickness direction.

3. The suspension board with circuit according to claim 1, wherein all of the pedestal supporting layers of the pedestals have same shapes as viewed from the thickness direction.

4. The suspension board with circuit according to claim 1, wherein the continuous portion has a substantially triangular shape in a plane view of the continuous portion in which a width thereof gradually widens in a direction away from the fan portion.

5. A suspension board with circuit including a supporting portion configured to support a slider and extending in a predetermined direction, comprising:
a metal supporting board,
a base insulating layer disposed at one surface of the metal supporting board,
a conductive pattern disposed at one surface of the base insulating layer,
a cover insulating layer disposed at the one surface of the base insulating layer so as to cover the conductive pattern, and
a supporting layer disposed at one surface of the cover insulating layer, wherein the supporting portion includes at least one pair of pedestals, each of the at least one pair of pedestals spaced apart from each other in the predetermined direction, wherein a thickness direction crosses the predetermined direction and passes through the metal supporting board, the base insulating layer, the conductive pattern, the cover insulating layer and the supporting layer;

each of the at least one pair of pedestals is configured to support the slider, and includes a pedestal base layer included in the base insulating layer,
a pedestal conductive layer included in the conductive pattern and disposed at one surface of the pedestal base layer,
a pedestal cover layer included in the cover insulating layer and disposed at one surface of the pedestal conductive layer, and
a pedestal supporting layer included in the supporting layer and disposed at one surface of the pedestal cover layer, wherein the thickness direction passes through the pedestal conductive layer, the pedestal cover layer and the supporting layer,
each pair of the at least one pair of pedestals has a first pedestal and a second pedestal, each of the first and second pedestals has a fan portion and a continuous portion, the fan portion in which at least a part of a circumferential end portion thereof has a circular arc shape and a continuous portion continuous from the fan portion in a circumferential direction thereof,
the pedestal conductive layer of the first pedestal has a protruding portion protruding outwardly in a radial direction of a phantom circle with respect to the phantom circle sharing a center with the fan portion; and
as viewed in the thickness direction, the pedestal supporting layer is disposed so as to overlap with the continuous portion in each pedestal.

6. The suspension board with circuit according to claim 5, wherein the at least one pair of pedestals is a plurality of pairs of pedestals, the supporting portion includes the plurality of pairs of pedestals with the pairs being at spaced intervals in a widthwise direction, the widthwise direction crosses the predetermined direction and the thickness direction.

7. The suspension board with circuit according to claim 5, wherein all of the pedestal supporting layers of the pedestals have same shapes as viewed from the thickness direction.

8. The suspension board with circuit according to claim 5, wherein the continuous portion has a substantially triangular shape in a plane view of the continuous portion in which a width thereof gradually widens in a direction away from the fan portion.

9. A suspension board with circuit including a supporting portion configured to support a slider and extending in a predetermined direction, comprising:
a metal supporting board,
a base insulating layer disposed at one surface of the metal supporting board,
a conductive pattern disposed at one surface of the base insulating layer, a cover insulating layer disposed at the one surface of the base insulating layer so as to cover the conductive pattern, and a supporting layer disposed at one surface of the cover insulating layer, wherein the supporting portion includes at least one pair of pedestals, each of the at least one pair of pedestals spaced apart from each other in the predetermined direction, wherein a thickness direction crosses the predetermined direction and passes through the metal supporting board, the base insulating layer, the conductive pattern, the cover insulating layer and the supporting layer;

each of the at least one pair of pedestals is configured to support the slider, and includes a pedestal base layer included in the base insulating layer,
- a pedestal conductive layer included in the conductive pattern and disposed at one surface of the pedestal base layer,
- a pedestal cover layer included in the cover insulating layer and disposed at one surface of the pedestal conductive layer, and
- a pedestal supporting layer included in the supporting layer and disposed at one surface of the pedestal cover layer, wherein the thickness direction passes through the pedestal conductive layer, the pedestal cover layer and the supporting layer, each pair of the at least one pair of pedestals has a first pedestal and a second pedestal, each of the first and second pedestals has a fan portion and a continuous portion, the fan portion in which at least a part of a circumferential end portion thereof has a circular arc shape and a continuous portion continuous from the fan portion in a circumferential direction thereof, the pedestal conductive layer of the first pedestal has a protruding portion protruding outwardly in a radial direction of a phantom circle with respect to the phantom circle sharing a center with the fan portion; and as viewed in the thickness direction, the pedestal supporting layer is disposed so as to overlap with the fan portion and so as not to overlap with the continuous portion in each pedestal.

10. The suspension board with circuit according to claim 9, wherein the at least one pair of pedestals is a plurality of pairs of pedestals, the supporting portion includes the plurality of pairs of pedestals with the pairs being at spaced intervals in a widthwise direction, the widthwise direction crosses the predetermined direction and the thickness direction.

11. The suspension board with circuit according to claim 9, wherein all of the pedestal supporting layers of the pedestals have same shapes as viewed from the thickness direction.

12. The suspension board with circuit according to claim 9, wherein the continuous portion has a substantially triangular shape in a plane view of the continuous portion in which a width thereof gradually widens in a direction away from the fan portion.

* * * * *